United States Patent

Kamiaka et al.

[11] Patent Number: 5,834,106
[45] Date of Patent: Nov. 10, 1998

[54] CERAMIC SUBSTRATE AND PRODUCING PROCESS THEREOF, AND A SUCTION CARRIER FOR WAFERS USING A CERAMIC WAFER-CHUCKING SUBSTRATE

[75] Inventors: Hideto Kamiaka, Tokyo; Yukio Kishi, Funabashi, both of Japan

[73] Assignee: Nihon Cement Co., Ltd., Tokyo, Japan

[21] Appl. No.: 343,464

[22] PCT Filed: Feb. 2, 1993

[86] PCT No.: PCT/JP93/00120

§ 371 Date: Nov. 28, 1994

§ 102(e) Date: Nov. 28, 1994

[87] PCT Pub. No.: WO93/24925

PCT Pub. Date: Dec. 9, 1993

[30] Foreign Application Priority Data

| May 26, 1992 | [JP] | Japan | 4-158582 |
| May 26, 1992 | [JP] | Japan | 4-158666 |
| May 26, 1992 | [JP] | Japan | 4-158697 |
| May 26, 1992 | [JP] | Japan | 4-158774 |

[51] Int. Cl.$^6$ .......................... B32B 3/26; C04B 385/48; B21F 41/00
[52] U.S. Cl. .................. 428/304.4; 428/312.2; 428/315.5; 501/134; 29/25.01
[58] Field of Search .......... 428/304.4, 433, 428/312.2, 315.5; 501/134, 136; 29/25.01

[56] References Cited

U.S. PATENT DOCUMENTS

| 4,673,660 | 6/1987 | Thanh | 501/135 |
| 4,894,273 | 1/1990 | Lieberman et al. | 428/209 |
| 5,518,969 | 5/1996 | Ragan | 428/433 |
| 5,532,031 | 7/1996 | Farooq et al. | 428/675 |
| 5,585,173 | 12/1996 | Kamo et al. | 428/304.4 |

FOREIGN PATENT DOCUMENTS

| 0408350A2 | 1/1991 | European Pat. Off. . |
| 0411639A2 | 2/1991 | European Pat. Off. . |
| 60022733 | 7/1983 | Japan . |
| 61042730 | 8/1984 | Japan . |
| 2-30159 | 7/1988 | Japan . |
| 2-81457 | 9/1988 | Japan . |
| 2-116142 | 10/1988 | Japan . |

*Primary Examiner*—Cathy F. Lam
*Attorney, Agent, or Firm*—Jacobson, Price, Holman & Stern, PLLC

[57] ABSTRACT

A ceramic substrate for a hard disc, a thin film chip capacitor, and hybrid ICs, and a suction carrier for a substrate is constituted by using a titanium oxide or aluminum oxide substrate having an extremely small number of pores having diameters of 3 $\mu$m or more on the substrate surface.

The substrate is produced by baking highly purified titanium oxide fine powder or highly purified aluminum oxide fine powder in the air, an inert atmosphere or a reducing atmosphere (at 1,100° C. to 1,300° C. for the former and at 1,200° to 1,400° C. for the latter) and HIP treating the baked material.

4 Claims, No Drawings

5,834,106

CERAMIC SUBSTRATE AND PRODUCING PROCESS THEREOF, AND A SUCTION CARRIER FOR WAFERS USING A CERAMIC WAFER-CHUCKING SUBSTRATE

TECHNICAL FIELD

The present invention relates to a ceramic substrate and producing process thereof, and a suction carrier for wafers using a ceramic wafer-chucking substrate.

In detail, the present invention relates to a hard disc substrate and a producing process thereof, and in particular, to a hard disc substrate of a ceramic substrate made of sintered titanium oxide or aluminum oxide and a producing process thereof.

Also, the present invention relates to a thin-film chip capacitor consisting of a bottom thin-film electrode, a thin-film dielectric and a top thin-film electrode all formed on a substrate in that order, and in particular, to a thin-film chip capacitor using as the substrate a ceramic substrate made of a titanium oxide sintered body or aluminum oxide body.

Further, the present invention relates to a thin-film chip capacitor consisting of a bottom thin-film electrode, a thin-film dielectric and a top thin-film electrode all formed on a substrate in that order, wherein a titanium oxide substrate serves as both the substrate itself and the bottom thin-film electrode, alternatively, the titanium oxide substrate further serves as the thin-film dielectric.

Still further, the present invention relates to a ceramic substrate for hybrid ICs and a producing process thereof, and in particular to a ceramic substrate for hybrid ICs for forming a thin-film hybrid integrated circuit and a producing process thereof.

Furthermore, the present invention relates to a substrate chucking device comprising a wafer-chucking substrate for chucking and transporting or suction chucking and fixing a wafer, and in particular, to a substrate chucking device in association with a wafer hand and a wafer holder for suction chucking and transporting or fixing a wafer such as a semiconductor wafer etc.

BACKGROUND ART

Conventionally, Winchester discs have been known as a representative of magnetic disc memory devices (hard disc drives) which uses a non-magnetic metal disc for a recording magnetic disc.

The Winchester disc is a disc memory characterized in that a magnetic hard disc for recording is mounted in an unremovable or hermetically sealed disc pack together with a flying inductive head disposed above the disc surface without physical contact.

The above recording magnetic disc uses a flat substrate (a hard disc substrate) with a magnetic material layer coated thereon for recording information.

As the hard disc substrates of this kind, metallic substrates made from aluminum, an aluminum alloy or the like have been used conventionally.

Recently, development of hard discs of this kind for high-capacity has been actively being pursued, and in order to increase the recording capacity of hard discs, it is necessary to reduce a flying height of the aforementioned head from the disc surface.

To reduce the flying height of the head, flatness of the disc substrate needs to be reduced, but the improvement in flatness of the conventionally used metallic substrates of aluminum, an aluminum alloy or the like almost has come to a limit; therefore, it is difficult to fabricate flatter substrates using these materials.

As regards flatness, since ceramic substrates can be more easily fabricated than the metallic substrates, hard disc substrates made of ceramics have been desired.

It is true that ceramic substrates can be fabricated to have improved flatness, but the ceramic substrates suffer from the occurrence of many pores of 3 μm or more in diameter on the surface thereof. Hence, it has been a problem that no ceramic substrate can be obtained without pores present on its surface.

It is therefore the first object of the present invention to provide a hard disc substrate made of ceramic in which large pores having diameters of 3 μm or more, extremely rarely exist and to provide a producing process thereof, so as to provide a hard disc substrate which enables hard discs to have increased capacity.

And, in various types of chip capacitors at present, multi-layer ceramic capacitors are predominantly used. The capacitor of this type, however, needs a complicated production process. Further, in order to make the capacitor highly capacitive, the number of layers must be increased, which again complicates the production process. For these reasons, studies and research for creating chip capacitors with thin-films have vigorously been made in recent years.

However, as to the thin-film chip capacitor, since its electrodes and dielectric layer are formed less than some micro-meters in thickness, if there exist any large pores on the surface of a substrate used for forming the thin-film electrodes and thin-film dielectric layer, breakdown may occur, or in extreme cases, it is impossible to even form a capacitor with such substrate. For this reason, nowadays, development of ceramic substrates having only a small number of pores on the surface thereof has been strongly desired.

It is therefore the second object of the present invention to provide a thin-film chip capacitor using a ceramic substrate as satisfying the aforementioned demand. More specifically, it is an object of the present invention to provide a thin-film chip capacitor using a ceramic substrate which is made of titanium oxide or aluminum oxide and has an extremely small number of large-sized pores with diameters of 3 μm or more on the surface thereof, so that a thin-film chip capacitor which has an increased capacitance can be provided.

It is another object of the present invention to provide a thin-film chip capacitor composed of a titanium oxide substrate which has an extremely small number of large-sized pores with diameters of 3 μm or more on the surface thereof, and which can be used as both a substrate itself and a bottom thin-film electrode, alternatively, which can further serve as a thin-film dielectric.

Further, various kinds of ceramic substrates have been used as a printed circuit board for hybrid ICs. Meanwhile, a ceramic substrate composed of, for example, a titanium oxide substrate or an aluminum oxide substrate has many large pores with diameters of 3 μm or more on the surface thereof, therefore it is inappropriate as a printed circuit board for hybrid ICs.

For this reason, the glass coating is applied onto the ceramic substrate in order to eliminate the pores on the substrate surface, and the thus glass-layer coated ceramic substrates have been used up to now.

Also, as ICs have become highly integrated, the high-density interconnection patterning technology of boards for mounting ICs is considered as to be an important subject in these days. Therefore, in order to increase the interconnection patterning density, various studies and research have been made on the technology of fine patterning.

As the patterning of interconnections becomes fine, the existence and number of pores on the surface of substrates to be patterned, especially, pores with diameters of 30 μm or more, becomes a critical problem.

In order to solve the above problem, glass-layer coated ceramic substrates have been used as stated already. This substrate, however, not only requires a complicated process of coating a glass layer but also suffers from drawbacks such as of peeling of the glass layer off the ceramic substrate at the time of substrate production or at time of patterning. Alternatively, in some pattern forming means, the glass-layer coated substrates cannot be used.

For these reasons, single-component ceramic substrates of high purity which do not require any coating such as glass coating or the like coated on the surface thereof and which have no pores on the surface thereof have been strongly demanded.

It is therefore the third object of the present invention to provide a substrate for hybrid ICs made of ceramic capable of satisfying the above demand and a producing process thereof.

In detail, it is an object of the present invention to provide a ceramic substrate for hybrid ICs having an extremely small number of pores with diameters of 3 μm or more on the substrate surface with no pores with a diameter of 30 μm or more, and a producing process thereof, thereby making it possible to improve the fineness of patterning interconnections on the substrate as well as to increase the density of interconnection patterning.

Furthermore, a wafer hand as well as a wafer holder built into fabricating apparatuses for semiconductor integrated circuits holds wafers by vacuum suction through a wafer-chucking plate, so as to transfer or fix the wafer by means of vacuum suction.

As the wafer-chucking substrate for wafer hands and wafer holders, a wafer-chucking substrate made of alumina, that is, of an insulator, has been used conventionally.

Meanwhile, in fabrication lines for ICs, existence of dust is extremely undesirable, so that various measures are taken into consideration against dust. In the case of using a conventional alumina wafer-chucking substrate, this wafer-chucking substrate tends to carry static charges, and therefore has a drawback of being likely to attract dust due to such static charges.

In order to eliminate this defect, more specifically, in order to remove the static charges staying on the alumina wafer-chucking plate, some proposals have been made including a method of coating a conductive material on the wafer-chucking plate.

This process of coating a conducting material, however, needs complicated procedures and involves a lot of other problems. For this reason, a ceramic wafer-chucking plate which dose not need such a process has been desired.

That is, a ceramic-made wafer-chucking substrate has been desired, which, unlike the conventional, insulator-made or alumina-made wafer-chucking plates, has a low specific resistance and therefore will never bear static charges.

Alternatively, in a case where many pores exist on the surface of a wafer-chucking substrate, especially when a lot of large-sized pores (e.g., pores with diameters of 3 μm or more) exist, the following problems occur:

(a) the pores attract dust and dirt, and the thus adhered dust and dirt may cause problems such as of contaminating the semiconductor fabrication line; and (b) gases and the like may adsorb into the pores, thereby deteriorating the efficiency of suction and holding thin plates, such as semiconductor wafers.

Accordingly, nowadays, a wafer-chucking substrate satisfying the aforementioned demand and capable of eliminating the above problems (a) and (b), or more specifically, a ceramic-made wafer-chucking substrate which has a low specific resistance and an extremely small number of pores on its surface has been strongly desired.

It is therefore the forth object of the present invention to provide a substrate chucking device comprising a ceramic wafer-chucking substrate satisfying the above demands.

In detail, it is an object of the present invention to provide a substrate chucking device equipped with a ceramic wafer-chucking substrate having a low specific resistance and an extremely small number of pores on the surface thereof, as well as to provide a substrate chucking device equipped with a ceramic wafer-chucking substrate which allows easy prevention against static charges, and is able to largely contribute to high-integration as well as a high yield of semiconductor devices.

DISCLOSURE OF INVENTION

To achieve the first object, the present invention is characterized by a hard disc substrate made of ceramic substrate, comprising a titanium oxide substrate or an aluminum oxide substrate which has an extremely small number of pores, i.e., 100 pores per 1 $mm^2$ or less, having diameters of 3 μm or more on its substrate surface. The present invention is also characterized by a producing process of such substrate, including the steps of: using as a starting material titanium oxide or aluminum oxide powder having a specific average particle size and a specific purity; and baking it under specific baking conditions.

That is, a gist of the hard disc substrate of the present invention resides in a hard disc substrate composed of a titanium oxide substrate or an aluminum oxide substrate and is characterized in that the number of pores having diameters of 3 μm or more on the substrate surface is 100 pores per 1 $mm^2$ or less.

Further, a gist of the producing process of the substrate above, for the case of a producing process of a titanium oxide substrate, resides in a producing process of a hard disc substrate composed of a titanium oxide substrate comprising the steps of:

(A) molding titanium oxide powder having a purity of 99% or more and an average particle size of 1 μm or less, and baking the molding in the air atmosphere, an inert atmosphere or a reducing atmosphere at a temperature of 1,100° to 1,300° C.;

(B) subjecting the resultant sintered molding to a hot isostatic pressing (HIP) treatment under a pressure of 500 $kg/cm^2$ or more; and (C) heat-treating the HIP-treated molding at a temperature of 700° to 900° C.

Another gist of the producing process for the case of an aluminum oxide substrate resides in a producing process of a hard disc substrate composed of an aluminum oxide substrate, comprising the steps of:

(A) molding aluminum oxide powder having a purity of 99% or more, with an average particle size of 1 μm or less and baking the molding in the air atmosphere, an inert atmosphere or a reducing atmosphere at a temperature of 1,200° to 1,400° C.; and (B) subjecting the resultant sintered molding to a hot isostatic pressing (HIP) treatment under a pressure of 500 kg/cm² or more.

To achieve the second object, the present invention is characterized by using a thin-film chip capacitor substrate composed of a titanium oxide substrate or an aluminum oxide substrate in which the number of pores having diameters of 3 µm or more on the substrate surface is 100 pores per 1 mm² or less. Further, in the case of a titanium oxide substrate, the present invention is characterized by using the substrate as, other than the substrate itself, a bottom thin-film electrode, and further as a thin-film dielectric.

That is, the gist of the present invention is described as follows.

A thin-film chip capacitor consisting of a bottom thin-film electrode, a thin-film dielectric and a top thin-film electrode all formed on a substrate in that order, being characterized in that the substrate is composed of a titanium oxide substrate or an aluminum oxide substrate in which the number of pores having diameters of 3 µm or more on the substrate surface is 100 pores per 1 mm² or less.

A thin-film chip capacitor consisting of a bottom thin-film electrode, a thin-film dielectric and a top thin-film electrode all formed on a substrate in that order, being characterized in that the aforementioned substrate is composed of a semiconductorized titanium oxide substrate in which the number of pores having diameters of 3 µm or more on the substrate surface is 100 pores per 1 mm² or less, and is used as both the substrate itself and the bottom thin-film electrode.

A thin-film chip capacitor consisting of a bottom thin-film electrode, a thin-film dielectric and a top thin-film electrode all formed on a substrate in that order, being characterized in that a substrate composed of a semiconductorized titanium oxide substrate having an insulatorized surface on which the number of pores having diameters of 3 µm or more is 100 pores per 1 mm² or less is used as both the substrate itself and the bottom thin-film electrode; and the insulatorized surface is used as the thin-film dielectric.

Further, to achieve the third object, the present invention is characterized by a ceramic substrate for hybrid ICs composed of a titanium oxide substrate or an aluminum oxide substrate which does not have any coating such as glass coating or the like coated on the surface thereof and which has an extremely small number of pores, i.e., 100 pores per 1 mm² or less, having diameters of 3 µm or more on the substrate surface.

The present invention is also characterized by a producing process of the substrate, including the steps of: using as a starting material titanium oxide or aluminum oxide powder having a specific average particle size and a specific purity; and baking it at specific baking condition.

That is, a gist of the ceramic substrate for hybrid ICs of the present invention resides in a ceramic substrate for hybrid ICs composed of a titanium oxide substrate or an aluminum oxide substrate which does not have any coating such as glass coating or the like coated on the surface thereof, and is characterized in that the number of pores having diameters of 3 µm or more on the substrate surface is 100 pores per 1 mm² or less and there is no pore with a diameter of 30 µm or more.

Further, a gist of the producing process of the ceramic substrate for hybrid ICs, for the case of a producing process of a titanium oxide substrate resides in a producing process of a ceramic substrate for hybrid ICs composed of a titanium oxide substrate, comprising the steps of:

(A) molding titanium oxide powder having a purity of 99% or more, with an average particle size of 1 µm or less, and baking the molding in the air atmosphere or an inert atmosphere at a temperature of 1,100 ° to 1,300° C.; and (B) subjecting the sintered molding obtained in the above (A) to a hot isostatic pressing (HIP) treatment under a pressure of 500 kg/cm² or more and heat-treating the molding at a temperature of 700 to 900 ° C.;

(C) baking the molding in a reducing atmosphere in place of the air atmosphere or an inert atmosphere in the above (A), and further heat-treating the molding at a temperature of 700 ° to 900° C.; and (D) baking the molding in a reducing atmosphere in place of the air atmosphere or an inert atmosphere in the above (A), and further subjecting the molding to a hot isostatic pressing (HIP) treatment under a pressure of 500 kg/cm² or more and heat-treating the molding at a temperature of 700° to 900° C.

Another gist of the producing process for the case of an aluminum oxide substrate resides in a producing process of a ceramic substrate for hybrid ICs composed of an aluminum oxide substrate, comprising the steps of:

(A) molding aluminum oxide powder having a purity of 99% or more, with an average particle size of 1 µm or less and baking the molding in the air, an inert atmosphere or a reducing atmosphere at a temperature of 1,200° to 1,400° C.; and (B) subjecting the sintered molding obtained the above (A) to a hot isostatic pressing (HIP) treatment under a pressure of 500 kg/cm² or more.

To achieve the forth objection, the present invention is characterized in that: a wafer-chucking plate made of titanium oxide is used as a ceramic wafer-chucking substrate; the wafer-chucking substrate has a specific resistance of 1.0 Ω·cm or less; and the number of pores with diameters of 3 µm or more on the surface thereof is 100 pores or less per 1 mm. With this configuration, the present invention is to provide a wafer chucking device for achieving the above objects.

That is, a gist of the present invention resides in a wafer chucking device comprising a wafer-chucking substrate for suction chucking and transporting or fixing a wafer, being characterized in that the wafer-chucking substrate is made of titanium oxide and has a specific resistance of 1.0 Ω·cm or less and the number of pores with diameters of 3 µm or more on the surface thereof is 100 pores or less per 1 mm².

Best Mode for Carrying Out the Invention

Now, detail of the present invention will be described. The inventors of the invention have earnestly studied the producing process of ceramic substrates free from pores on the surface thereof, and as a result they found the fact that, in accordance with the producing process of the present invention, it is possible to obtain a sintered body of titanium oxide or aluminum oxide which has an extremely small number of pores on its surface, thus having completed the present invention.

That is, the inventors hereof found that, in accordance with the producing process of the present invention, pores can be prevented from appearing outside due to the accumulation of pores to grain boundaries and can be retained inside crystal grains as extra-fine pores, thus having completed the present invention.

In the present invention, titanium oxide powder or aluminum oxide powder used as a starting material is preferably highly purified 99% or more. With any powder having a purity of less than 99%, it is hardly possible to obtain a targeted result of the present invention, that is, a substrate with an extremely small number of pores on the surface thereof (a substrate in which the number of pores having diameters of 3 μm or more on the substrate surface thereof is 100 pores per 1 mm² or less), thus resulting in undesirable outcome (see comparative examples 5, 6, 13 and 14 described below).

The average particle size of the above starting powder is preferably 1 μm or less. If the size exceeds 1 μm, it is difficult to obtain a substrate with a very small number of pores on the surface thereof which is also the object of the present invention, thus resulting in undesirable outcome (see comparative examples 7, 8, 15 and 16 described below).

As referring to further details as to the starting powder used in the present invention, if the purity is less than 99%, or if the average particle size is greater than 1 μm, low temperature sintering properties fail as will be described later and consequently the sintered density can not be enough raised.

On the other hand, if the powder is sintered at high-temperatures in order to raise the sintered density, grains tend to grow large and pores become large and rough (see comparative examples 1 to 16 described below).

Accordingly, in the present invention, it is preferable to use as the starting material titanium oxide powder or aluminum oxide powder which has an average particle size of not more than 1 μm and is highly purified 99% or more, and it is more preferable to use titanium oxide powder or aluminum oxide powder which has an average particle size of not more than 0.5 μm and is highly purified 99.8% or more.

In the present invention, the above starting powder is formed into ceramic green sheets by the Doctor-blade process, the extrusion process or the like.

The thus obtained ceramic green sheet is subjected, as required, to a treatment for burning out binder, and then is baked while the baking condition being controlled. The baking temperature conditions for titanium oxide substrates and aluminum oxide substrates differ from each other. Specifically, titanium oxide substrates are baked at 1,100° to 1,300° C. whereas aluminum oxide substrates are baked at 1,200° to 1,400° C.

As to the aforementioned baking temperatures, if the baking temperature is lower than 1,100° C. (in the case of titanium oxide substrates) or lower than 1,200° C. (in the case of aluminum oxide substrates), sintering itself is unlikely to proceed and therefore well-sintered body is difficult to obtain. On the other hand, if the baking temperature exceeds 1,300° C. (in the case of titanium oxide substrates) or 1,400° C. (in the case of aluminum oxide substrates), it is difficult to obtain the target of the present invention, that is, substrates with a very small number of pores on the surface thereof, thus leading to undesirable results.

Referring further to the aforementioned baking temperature, the starting material in the present invention is baked at lower temperatures (that is, 1,100° to 1,300° C. for the case of titania ceramics and 1,200° to 1,400° C. for alumina ceramics) than typical baking temperatures at which titania ceramics and alumina ceramics are formed (the former used to be baked at 1,350° C. and the latter used to be baked at 1,500° to 1,600° C.). And, a baking temperature exceeding 1,300° C. (in the case of titanium oxide substrates) or 1,400° C. (in the case of aluminum oxide substrates), excessively promotes grain growth (or crystal growth), causing pores to move to the grain boundary phase and making pores rough and large as the grains grow large, thereby bringing about undesirable result.

In the present invention, in order to facilitate the starting material to be sintered at low temperatures (that is, in order to make the low temperature sintering properties effective), the aforementioned titanium oxide powder or aluminum oxide powder which has an average particle size of not more than 1 μm and is highly purified 99% or more, is to be used as the starting material.

In the present invention, in order to lessen the number of pores on the surface, the sintered body of titanium oxide or aluminum oxide obtained under the above baking condition may additionally be subjected to a HIP treatment (for example, a treatment in a HIP furnace having a carbon heater).

The HIP treatment is preferably conducted at a temperature lower to some extent than the baking temperature, in view of preventing pores from becoming large due to the grain growth. Additionally, the pressure during the HIP treatment is preferably 500 kg/cm² or more, more preferably 1,500 kg/cm² or more. The HIP treatment condition for the case of titanium oxide differs from that for the case of aluminum oxide. Specifically, the HIP treatment for the former case is preferably conducted at a temperature of 800° to 1,100° C. under a pressure of 1,500 kg/cm² while the HIP treatment for the latter case is preferably conducted at a temperature of 1,000° to less than 1,400° C. under a pressure of 1,800 kg/cm².

As regards atmospheres during the baking process, the baking may be done under an inert atmosphere (e.g., argon atmosphere) or a reducing atmosphere (e.g., nitrogen atmosphere using a carbon heater etc.), for either case of titanium oxide or aluminum oxide.

Of the above-mentioned atmospheres, in the case where the baking is done in a reducing atmosphere, titanium oxide substrates, unlike aluminum oxide substrates, become semi-conductive as being baked. Further, in the case of titanium oxide substrates, the resulting substrate even after being subjected to the aforementioned HIP treatment (for example, a HIP treatment using a carbon heater) bears semiconductive features, unlike the case of aluminum oxide substrates.

On the surface of a hard disc substrate, a magnetic material is formed by sputtering or any other treatment. The features of the thus formed magnetic coating may differ depending upon the surface state of the substrate used.

In such cases, it is possible, if necessary, to obtain a non-conductive substrate by heat-treating the surface of the substrate which has been made semiconductive, at a temperature of 700° to 900° C. in the air atmosphere so that the surface may become non-conductive.

The thus obtained titanium oxide substrates or aluminum substrates can be surface ground or subjected to the surface lapping, as required.

Next, detail of the present invention will be described. The inventors of the invention have earnestly studied producing processes of ceramics having an extremely small number of pores on its surface, and as a result, they found the fact that, in accordance with the following producing processes (A) to (E), it is possible to obtain a ceramic substrate (a titanium oxide substrate or aluminum oxide substrate) satisfying the objects of the present invention, thus having completed a thin film chip capacitor of the present invention.

(For a titanium oxide substrate)

(A) A process including the steps of molding highly purified titanium oxide powder and baking the molding in the air atmosphere, an inert atmosphere or a reducing atmosphere at a temperature of 1,100° to 1,300° C.

(B) A process further including a step of subjecting the sintered body obtained in the above (A) to a hot isostatic pressing (HIP) treatment.

(C) A process further including a step of heat-treating at a temperature of 700° to 900° C. the titanium oxide obtained from the baking process under a reducing atmosphere of the above process (A), or the sintered body obtained from the above (B).

(For an aluminum oxide substrate)

(D) A process including the steps of molding highly purified aluminum oxide powder and baking the molding in the air atmosphere, an inert atmosphere or a reducing atmosphere at a temperature of 1,200° to 1,400° C.

(E) A process further including a step of subjecting the sintered body obtained in the above (D) to a hot isostatic pressing (HIP) treatment.

That is, the inventors hereof found that, in accordance with the producing processes stated above (A) to (E), pores can be prevented from appearing outside due to the accumulation of pores to grain boundaries and can be retained inside crystal grains as extra-fine pores, whereby it becomes possible to obtain the targeted results of the present invention, that is, a sintered body of titanium oxide or aluminum oxide in which large-sized pores with diameters of 3 µm or more extremely rarely appear on the surface thereof, thus having completed the present invention wherein the sintered body is used as a substrate for thin-film chip capacitors.

Further, the present inventors hereof found the fact that, in accordance with the baking process in a reducing atmosphere of the aforementioned process (A) for the titanium oxide substrate, it is possible to not only obtain a titanium oxide substrate having an extremely small number of pores on the surface thereof but also to obtain a semiconductorized titanium oxide substrate (this will be described below in detail), thus having completed the second invention wherein the semiconductorized titanium oxide substrate is used as both the substrate itself and a bottom thin-film electrode. The HIP treatment stated in above (B) also provides a semiconductorized titanium oxide, which can also be used as both the substrate itself and a bottom thin-film electrode.

Here, it should be noted that it is also possible to create a bottom thin-film electrode on the semiconductorized titanium oxide substrate obtained thereby and use it as a mere substrate.

Moreover, the present inventors hereof found that in accordance with the process further including a heat treatment at a temperature of 700° to 900° C., stated in above (C.) for the titanium oxide substrate, an insulating thin-film is further formed on the top of the surface of the semiconductorized titanium oxide and the insulatorized portion can be used as a thin-film dielectric with the use of the substrate as both the substrate itself and the bottom thin-film electrode, thus having completed the third invention.

In the aforementioned producing processes (A) to (E), titanium oxide powder or aluminum oxide powder used as a starting material is preferably highly purified 99% or more. With any powder having a purity of less than 99%, it is hardly possible to obtain a targeted result of the present invention, that is, a substrate with an extremely small number of pores on the surface thereof (a substrate in which the number of pores having diameters of 3 µm or more on the substrate surface thereof is 100 pores per 1 mm² or less), thus presenting undesirable outcome (see comparative examples 5, 6, 13 and 14 described below).

The average particle size of the above starting powder is preferably 1 µm or less. If the size exceeds 1 µm, it is difficult to obtain a substrate with an extremely small number of pores on the surface thereof which is also the object of the present invention, thus presenting undesirable outcome (see comparative examples 7, 8, 15 and 16 described below).

As referring to further details as to the aforementioned starting powder, if the purity is less than 99%, or if the average particle size is greater than 1 µm, low temperature sintering properties fail as will be described later and consequently the sintered density can not be enough raised.

On the other hand, if the powder is sintered at high-temperatures in order to raise the sintered density, grains tend to grow large and pores become large and rough (see comparative examples 1 to 16 described below).

Accordingly, in the present invention, it is preferable to use as the starting material titanium oxide powder or aluminum oxide powder which has an average particle size of not more than 1 µm and is highly purified 99% or more, and it is more preferable to use titanium oxide powder or aluminum oxide powder which has an average particle size of not more than 0.5 µm and is highly purified 99.8% or more.

In the present invention, the above starting powder is formed into ceramic green sheets by the Doctor-blade process, the extrusion process or the like.

The thus obtained ceramic green sheet is subjected, as required, to a treatment for burning out binder, and then is baked while the baking condition being controlled. The baking temperature conditions for titanium oxide substrates and aluminum oxide substrates differ from each other. Specifically, titanium oxide substrates are baked at 1,100° to 1,300° C. whereas aluminum oxide substrates are baked at 1,200° to 1,400° C.

As to the aforementioned baking temperatures, if the baking temperature is lower than 1,100° C. (in the case of titanium oxide substrates) or lower than 1,200° C. (in the case of aluminum oxide substrates), sintering itself is unlikely to proceed and therefore well-sintered body is difficult to obtain. On the other hand, if the baking temperature exceeds 1,300° C. (in the case of titanium oxide substrates) or 1,400° C. (in the case of aluminum oxide substrates), it is difficult to realize the targeted results of the present invention, that is, substrates with an extremely small number of pores on the surface thereof, thus leading to undesirable result.

Referring further to the aforementioned baking temperature, the starting material in the present invention is baked at lower temperatures (that is, 1,100° to 1,300° C. for the case of titania ceramics and 1,200° to 1,400° C. for alumina ceramics) than typical baking temperatures at which titania ceramics and alumina ceramics are formed (the former used to be baked at 1,350° C. and the latter used to be baked at 1,500° to 1,600° C.). And, a baking temperature exceeding 1,300° C. (in the case of titanium oxide substrates) or 1,400° C. (in the case of aluminum oxide substrates), excessively promotes grain growth (or crystal growth), causing pores to move to the grain boundary phase and making pores rough and large as the grains grow large, thereby bringing about undesirable result.

In the present invention, in order to facilitate the starting material to be sintered at low temperatures (that is, in order to make the low temperature sintering properties effective), the aforementioned titanium oxide powder or aluminum oxide powder which has an average particle size of not more than 1 μm and is highly purified 99% or more, is to be used as the starting material.

In the present invention, in order to lessen the number of pores on the surface, the sintered body of titanium oxide or aluminum oxide obtained under the above baking condition may additionally be subjected to a HIP treatment (for example, a treatment in a HIP furnace having a carbon heater).

The HIP treatment is preferably conducted at a temperature lower to some extent than the baking temperature, in view of preventing pores from becoming large due to the grain growth. Additionally, the pressure during the HIP treatment is preferably 500 kg/cm$^2$ or more, more preferably 1,500 kg/cm$^2$ or more. The HIP treatment condition for the case of titanium oxide differs from that for the case of aluminum oxide. Specifically, the HIP treatment for the former case is preferably conducted at a temperature of 800° to 1,100° C. under a pressure of 1,500 kg/cm$^2$ while the HIP treatment for the latter case is preferably conducted at a temperature of 1,000° to less than 1,400° C. under a pressure of 1,800 kg/cm$^2$.

As regards atmospheres during the baking process, the baking may be done under an inert atmosphere (e.g., argon atmosphere) or a reducing atmosphere (e.g., nitrogen atmosphere using a carbon heater etc.), for either case of titanium oxide or aluminum oxide.

Of the above-mentioned atmospheres, in the case where the baking is done in a reducing atmosphere, titanium oxide substrates, unlike aluminum oxide substrates, become semiconductive as being baked. Further, in the case of titanium oxide substrates, the resulting substrate even after being subjected to the aforementioned HIP treatment (for example, a HIP treatment using a carbon heater) bears semiconductive features, unlike the case of aluminum oxide substrates.

The thus semiconductorized titanium oxide substrate can be made to serve also as a bottom electrode of a thin-film capacitor. Alternatively, it is also possible to produce a thin-film chip capacitor by creating a bottom thin-film electrode on the top of the substrate surface, and then forming a thin-film dielectric and a top thin-film electrode thereon.

When the thus heat-treated titanium oxide substrate is used, it is possible to construct a thin-film chip capacitor by merely forming a top thin-film electrode on the top surface thereof. That is, the semiconductorized substrate itself can be used as a bottom thin-film electrode while the insulator layer on the top surface can be used as a thin-film dielectric, and it is possible to complete a thin-film chip capacitor by merely providing a top thin-film electrode on the surface of the substrate.

The capacitance of the thus formed thin-film chip capacitor depends upon the thickness of an insulator layer on the substrate surface, so that it is possible to adjust and control the capacitance by properly varying temperatures and time of the heat treatment which is conducted at a temperature of 700° to 900° C. in the air atmosphere.

For example, a titanium oxide substrate heat-treated at a temperature of 700° to 900° C. in the air atmosphere for one hour was cut in 2 mm square and then, the thus cut sample was polished on one side (side A) to remove the insulator layer, and the opposite surface (side B) was deposited with Au. Then, a capacitance between A and B was measured.

When the substrate was subjected to the baking process in the air or an inert atmosphere of the above process (A), the capacitance was 320 pF;

when the substrate was subjected to the baking process in a reducing atmosphere of the above process (A), the capacitance was 250 pF; and when the substrate was subjected to the process further including a HIP treatment of the above process (B), the capacitance was 300 pF.

In the present inventions, the titanium oxide substrates or aluminum substrates thus obtained by the aforementioned processing processes (A) to (E) can be surface ground or subjected to the surface lapping, as required.

Next, detail of the present invention will be described. The inventors of the invention have earnestly studied the producing process of ceramic substrates free from pores on the surface thereof, and as a result they found the fact that, in accordance with the producing process of the present invention, it is possible to obtain a sintered molding of titanium oxide or aluminum oxide in which pores extremely rarely appear on the surface thereof and there is no pore having a diameter of 30 μm or more, thus completing the present invention.

That is, the inventors hereof found that, in accordance with the producing process, pores can be prevented from appearing outside due to the accumulation of pores to grain boundaries and can be retained inside crystal grains as extra-fine pores, thus having completed the present invention.

In the present invention, titanium oxide powder or aluminum oxide powder used as a starting material is preferably highly purified 99% or more. With any powder having a purity of less than 99%, it is hardly possible to obtain a targeted result of the present invention, that is, a substrate with an extremely small number of pores with diameters of 3 μm or more on the surface thereof, thus resulting in undesirable outcome (see comparative examples 5, 6, 13 and 14 described below).

The average particle size of the above starting powder is preferably 1 μm or less. If the size exceeds 1 μm, it is difficult to obtain the targeted result of the present invention or the aforementioned substrate, thus presenting undesirable outcome (see comparative examples 7, 8, 15 and 16 described below).

As referring to further details as to the starting powder used in the present invention, if the purity is less than 99%, or if the average particle size is greater than 1 μm, low temperature sintering properties fail as will be described later as will be described later and consequently the sintered density can not be enough raised.

On the other hand, if the powder is sintered at high-temperatures in order to raise the sintered density, grains tend to grow large and pores become large and rough (see comparative examples 1 to 16 described below).

Accordingly, in the present invention, it is preferable to use as the starting material titanium oxide powder or aluminum oxide powder which has an average particle size of not more than 1 μm and is highly purified 99% or more, and it is more preferable to use titanium oxide powder or aluminum oxide powder which has an average particle size of not more than 0.5 μm and is highly purified 99.8% or more.

In the present invention, the above starting powder is formed into ceramic green sheets by the Doctor-blade process, the extrusion process or the like.

The thus obtained ceramic green sheet is subjected, as required, to a treatment for burning out binder, and then is baked while the baking condition being controlled. The baking temperature conditions for titanium oxide substrates and aluminum oxide substrates differ from each other. Specifically, titanium oxide substrates are baked at 1,100° to 1,300° C. whereas aluminum oxide substrates are baked at 1,200 to 1,400° C.

As to the aforementioned baking temperatures, if the baking temperature is lower than 1,100° C. (in the case of titanium oxide substrates) or lower than 1,200° C. (in the case of aluminum oxide substrates), sintering itself is unlikely to proceed and therefore well-sintered body is difficult to obtain. On the other hand, if the baking temperature exceeds 1,300° C. (in the case of titanium oxide substrates) or 1,400° C. (in the case of aluminum oxide substrates), it is difficult to obtain the targeted result of the present invention, that is, substrates with an extremely small number of pores with diameters of 3 μm or more on the surface thereof with no pore with a diameter of 30 μm or more, thus presenting undesirable result.

Referring further to the aforementioned baking temperature, the starting material in the present invention is baked at lower temperatures (that is, 1,100° to 1,300° C. for the case of titania ceramics and 1,200° to 1,400° C. for alumina ceramics) than typical baking temperatures at which titania ceramics and alumina ceramics are formed (the former used to be baked at 1,350° C. and the latter used to be baked at 1,500° to 1,600° C.). And, a baking temperature exceeding 1,300° C. (in the case of titanium oxide substrates) or 1,400° C. (in the case of aluminum oxide substrates), excessively promotes grain growth (or crystal growth), causing pores to move to the grain boundary phase and making pores rough and large as the grains grow large, thereby bringing about undesirable result.

In the present invention, in order to facilitate the starting material to be sintered at low temperatures (that is, in order to make the low temperature sintering properties effective), the aforementioned titanium oxide powder or aluminum oxide powder which has an average particle size of not more than 1 μm and is highly purified 99% or more, is to be used as the starting material.

In the present invention, in order to lessen the number of pores on the surface, the sintered body of titanium oxide or aluminum oxide obtained under the above baking condition may additionally be subjected to a HIP treatment (for example, a treatment in a HIP furnace having a carbon heater).

The HIP treatment is preferably conducted at a temperature lower to some extent than the baking temperature, in view of preventing pores from becoming large due to the grain growth. Additionally, the pressure during the HIP treatment is preferably 500 kg/cm² or more, more preferably 1,500 kg/cm² or more. The HIP treatment condition for the case of titanium oxide differs from that for the case of aluminum oxide. Specifically, the HIP treatment for the former case is preferably conducted at a temperature of 800° to 1,100° C. under a pressure of 1,500 kg/cm while the HIP treatment for the latter case is preferably conducted at a temperature of 1,000° to less than 1,400° C. under a pressure of 1,800 kg/cm².

As regards atmospheres during the baking process, the baking may be done under an inert atmosphere (e.g., argon atmosphere) or a reducing atmosphere (e.g., nitrogen atmosphere using a carbon heater etc.), for either case of titanium oxide or aluminum oxide.

Of the above-mentioned atmospheres, in the case where the baking is done in a reducing atmosphere, titanium oxide substrates, unlike aluminum oxide substrates, become semiconductive as titanium oxide being reduced during the baking. Therefore, this semiconductorized substrate as it is cannot be used as a printed circuit board for hybrid ICs.

Accordingly, in order to make the semiconductorized surface become insulator, it is necessary to further subject the obtained titanium oxide sintered body thus baked in a reducing atmosphere to a heat-treatment at a temperature of 700° to 900° C. in the air atmosphere. In the case of titanium oxide substrates, since the aforementioned HIP-treated substrate also bears semiconductive features, this substrate must again be subjected to the heat treatment as above.

The thus obtained titanium oxide substrates or aluminum substrates can be surface ground or subjected to the surface lapping, as required.

Next, a hard disc substrate, thin film chip capacitor and a ceramic substrate for hybrid ICs of the present invention will be further described in detail referring to examples of the present invention together with comparative examples.

(Examples 1 to 4)

Polyvinyl butyral and ethyl alcohol were added to titanium oxide powder having a purity of 99.8% with an average particle size of 0.25 μm and mixed so as to be slurried. Then, a green sheet was prepared from the slurry by the Doctor-blade process.

After being subjected to the treatment for burning out binder, the green sheet was baked under a normal pressure sintering condition (at a temperature of 1,200° C. in the air atmosphere or nitrogen atmosphere) as shown in Table 1. Further, in examples 2 and 4, the thus baked sheet was HIP treated in a HIP heater having a carbon heater under argon atmosphere in a HIP treatment condition (at a temperature of 1,000° C. under a pressure of 1,500 kg/cm²) as shown in Table 1.

Next, the thus treated material was heat-treated in the air atmosphere at a temperature of 700° to 900° C. in examples 2 to 4 other than example 1.

The number of pores having diameters of 1 μm or more was counted as to each of the thus obtained titanium oxide substrates. The result is shown in Table 1. In these cases, no pore having a diameter of 30 μm or more was observed on the surface of each substrate.

Each surface of the substrates to be measured was observed and photographed by a scanning electron microscope and the thus obtained photography was used to estimate the number and diameter of pores on the surface of the substrate.

(Example 5)

Polyvinyl butyral and ethyl alcohol were added to titanium oxide powder having a purity of 99.2% with an average particle size of 0.7 μm and mixed so as to be slurried. Then, a green sheet was prepared from the slurry by the Doctor-blade process.

After being subjected to the treatment for burning out binder, the green sheet was baked under a normal pressure sintering condition (at a temperature of 1,200° C. in the air atmosphere) as shown in Table 1. Further, the thus baked sheet was HIP treated under argon atmosphere in a HIP treatment condition (of the same HIP treatment as in the above examples 2 and 4) as shown in Table 1. Thereafter, the treated sheet was heat-treated in the air atmosphere at a temperature of 700° to 900° C.

The number of pores was counted as to the thus obtained titanium oxide substrate in the same manner as in examples 1 to 4. The result is shown in Table 1. In this case, no pore having a diameter of 30μm or more was observed on the surface of the substrate.

(Examples 6 to 9)

Polyvinyl butyral and ethyl alcohol were added to aluminum oxide powder having a purity of 99.9% with an average particle size of 0.25 μm and mixed so as to be slurried. Then, a green sheet was prepared from the slurry by the Doctor-blade process.

After being subjected to the treatment for burning out binder, the green sheet was baked under a normal pressure sintering condition (at a temperature of 1,400° C. in the air atmosphere or nitrogen atmosphere) as shown in Table 1. Further, in examples 7 and 9, the thus baked sheet was HIP treated under argon atmosphere in a HIP treatment condition (at a temperature of 1,350° C. under a pressure of 1,800 kg/cm$^2$) as shown in Table 1.

The number of pores was counted as to each of the thus obtained aluminum oxide substrates in the same manner as in examples 1 to 4. The result is shown in Table 1. In these cases, no pore having a diameter of 30 μm or more was observed on the surface of each substrate.

(Example 10)

Polyvinyl butyral and ethyl alcohol were added to aluminum oxide powder having a purity of 99.2% with an average particle size of 0.6 μm and mixed so as to be slurried. Then, a green sheet was prepared from the slurry by the Doctor-blade process.

After being subjected to the treatment for burning out binder, the green sheet was baked under a normal pressure sintering condition (at a temperature of 1,400° C. in the air atmosphere) as shown in Table 1. Further, the thus baked sheet was HIP treated under argon atmosphere in a HIP treatment condition (at a temperature of 1,350° C. under a pressure of 1,800 kg/cm$^2$) as shown in Table 1.

The number of pores was counted as to the thus obtained aluminum oxide substrate in the same manner as in examples 1 to 4. The result is shown in Table 1. In this case, no pore having a diameter of 30 μm or more was observed on the surface of the substrate.

(Comparative Examples 1 to 8)

With titanium oxide powders each having a purity and an average particle size as shown in Table 2, green sheets were prepared in the same manner as in the above examples 1 to 4. After being subjected to the treatment for burning out binder, each green sheet was baked under a normal pressure sintering condition and HIP treated in a HIP condition shown in Table 2. Further, each of the thus treated sheets other than comparative examples 1, 5 and 7, was heat-treated in the similar manner to the above example.

The number of pores was counted in the same manner as in examples 1 to 4 as to each of the thus obtained titanium oxide substrates. The result is shown in Table 2.

(Comparative Examples 9 to 16)

With aluminum oxide powders each having a purity and an average particle size as shown in Table 2, green sheets were prepared in the same manner as in the above examples 6 to 9. After being subjected to the treatment for burning out binder, each green sheet was baked under a normal pressure sintering condition and HIP treated in a HIP condition shown in Table 2.

The number of pores was counted in the same manner as in examples 1 to 4 as to each of the thus obtained aluminum oxide substrates. The result is shown in Table 2.

TABLE 1

EXAMPLES

| No. | KIND OF OXIDES | PURITY (%) | AVERAGE PARTICLE SIZE (μm) | NORMAL SINTERING | | HIP TREATMENT CONDITION | | HEAT TREATMENT | NUMBER OF PORES (PORES/mm$^2$) |
|---|---|---|---|---|---|---|---|---|---|
| | | | | TEMPERATUR (°C.) | ATMOSPHERE | TEMPERATURE (°C.) | PRESSURE (kg/cm$^2$) | | |
| EXAMPLES | | | | | | | | | |
| 1 | TiO$_2$ | 99.8 | 0.25 | 1200 | AIR | (UNDONE) | | NON | 70 |
| 2 | TiO$_2$ | 99.8 | 0.25 | 1200 | AIR | 1000 | 1500 | DONE | 34 |
| 3 | TiO$_2$ | 99.8 | 0.25 | 1200 | NITROGEN | (UNDONE) | | " | 70 |
| 4 | TiO$_2$ | 99.8 | 0.25 | 1200 | NITROGEN | 1000 | 1500 | " | 38 |
| 5 | TiO$_2$ | 99.2 | 0.7 | 1200 | AIR | 1000 | 1500 | " | 92 |
| 6 | Al$_2$O$_3$ | 99.9 | 0.25 | 1400 | AIR | (UNDONE) | | NON | 85 |
| 7 | Al$_2$O$_3$ | 99.9 | 0.25 | 1400 | AIR | 1350 | 1800 | " | 48 |
| 8 | Al$_2$O$_3$ | 99.9 | 0.25 | 1400 | NITROGEN | (UNDONE) | | " | 82 |
| 9 | Al$_2$O$_3$ | 99.9 | 0.25 | 1400 | NITROGEN | 1350 | 1800 | " | 40 |
| 10 | Al$_2$O$_3$ | 99.2 | 0.6 | 1400 | AIR | 1350 | 1800 | " | 96 |

[NOTE]
*A carbon heater was used for heat-treating in nitrogen atmosphere.
*HIP treatment was conducted using a HIP furnace having a carbon heater.

TABLE 2

COMPARATIVE EXAMPLES

| No. | KIND OF OXIDES | PURITY (%) | AVERAGE PARTICLE SIZE ($\mu$m) | NORMAL SINTERING | | HIP TREATMENT CONDITION | | HEAT TREATMENT | NUMBER OF PORES (PORES/mm$^2$) |
|---|---|---|---|---|---|---|---|---|---|
| | | | | TEMPERATUR (°C.) | ATMOSPHERE | TEMPERATURE (°C.) | PRESSURE (kg/cm$^2$) | | |
| COMPARATIVE EXAMPLES | | | | | | | | | |
| 1 | TiO$_2$ | 99.8 | 0.25 | 1600 | AIR | (UNDONE) | | NON | 840 |
| 2 | TiO$_2$ | 99.8 | 0.25 | 1600 | AIR | 1400 | 1500 | DONE | 480 |
| 3 | TiO$_2$ | 99.8 | 0.25 | 1600 | NITROGEN | (UNDONE) | | " | 920 |
| 4 | TiO$_2$ | 99.8 | 0.25 | 1600 | NITROGEN | 1400 | 1500 | " | 770 |
| 5 | TiO$_2$ | 92.0 | 0.7 | 1400 | AIR | (UNDONE) | | NON | 960 |
| 6 | TiO$_2$ | 92.0 | 0.7 | 1400 | AIR | 1200 | 1800 | DONE | 550 |
| 7 | TiO$_2$ | 99.2 | 2.1 | 1400 | AIR | (UNDONE) | | NON | 710 |
| 8 | TiO$_2$ | 99.2 | 2.1 | 1400 | AIR | 1200 | 1800 | DONE | 310 |
| 9 | Al$_2$O$_3$ | 99.2 | 0.6 | 1600 | AIR | (UNDONE) | | NON | 1200 |
| 10 | Al$_2$O$_3$ | 99.2 | 0.6 | 1600 | AIR | 1400 | 1800 | " | 830 |
| 11 | Al$_2$O$_3$ | 99.2 | 0.6 | 1600 | NETROGEN | (UNDONE) | | " | 1310 |
| 12 | Al$_2$O$_3$ | 99.2 | 0.6 | 1600 | NETROGEN | 1400 | 1800 | " | 950 |
| 13 | Al$_2$O$_3$ | 96.0 | 0.5 | 1500 | AIR | (UNDONE) | | " | 1000 |
| 14 | Al$_2$O$_3$ | 96.0 | 0.5 | 1500 | AIR | 1400 | 1800 | " | 470 |
| 15 | Al$_2$O$_3$ | 99.5 | 3.5 | 1500 | AIR | (UNDONE) | | " | 1150 |
| 16 | Al$_2$O$_3$ | 99.5 | 3.5 | 1500 | AIR | 1400 | 1800 | " | 620 |

[NOTE]
*A carbon heater was used for heat-treating in nitrogen atmosphere.
*HIP treatment was conducted using a HIP furnace having a carbon heater.

As apparent from Table 1 above, in examples 1 and 3 in which titanium oxide powder having a purity of 99.8% with an average particle size of 0.25 $\mu$m was molded, thereafter baked at 1,200° C. in the air or nitrogen gas, substrates having 70 pores/mm$^2$ were obtained. In examples 2 and 4 in which the sintered bodies obtained in examples 1 and 3 were further HIP treated, substrates having 34 pores/mm$^2$ and 38 pores/mm$^2$, respectively were obtained.

From the result, it can be understood that additionally conducted HIP treatment will extremely lessen the pores present on the substrate surface and therefore create more preferable hard disc substrates.

Similarly, in examples 6 and 8 in which aluminum oxide powder having a purity of 99.9% with an average particle size of 0.25 $\mu$m was molded, thereafter baked at 1,400° C. in the air or nitrogen gas, substrates having 85 pores/mm$^2$ and 82 pores/mm$^2$, respectively were obtained. In examples 7 and 9 in which the sintered bodies obtained in examples 6 and 8 were further HIP treated, substrates having 48 pores/mm$^2$ and 40 pores/mm$^2$, respectively were obtained.

From the result, it can be understood that, as in the cases of the above titanium oxide substrate, additionally conducted HIP treatment will also extremely lessen the pores present on the aluminum oxide substrate surface and therefore create more preferable hard disc substrate, thin film chip capacitor and a ceramic substrate for hybrid ICs.

In example 5 in which titanium oxide powder having a purity of 99.2% with an average particle size of 0.7 $\mu$m (a starting material which has an average diameter of greater and a purity lower than those in example 2 but both falling within the scope of the present invention) was used, as well as in example 10 in which aluminum oxide powder having a purity of 99.2% with an average particle size of 0.6 $\mu$m (a starting material which has an average diameter of greater and a purity lower than those in example 7 but both falling within the scope of the present invention) was used, substrates having 92 pores/mm$^2$ and 96 pores/mm$^2$ (both of which fall within a target value of the present invention, i.e., 100 pores) were obtained, respectively, though the numbers of pores were greater than those of examples 2 and 7. Therefore, both of them can be used as a hard disc substrate, thin film chip capacitor and a ceramic substrate for hybrid ICs.

As is apparent from the Table 2 above, in contrast with the above examples 1 to 10, in the cases where, even with starting powder having a purity of 99% or more with an average particle size of 1 m or less, both of which fall within the limitation of the present invention, if the material had been baked at a temperature beyond the scope of the baking temperatures (the sintering temperature: 1,100° to 1,300° C. for titanium oxide powder; and 1,200° to 1,400° C. for aluminum oxide powder) limited by the present invention, particularly when, as in comparative examples 1 to 4 and 9 to 12, the material was baked at a temperature of 1,600° C., which exceeds the upper boundary of the limitation; substrates obtained had at least about 500 pores/mm$^2$ to about 1,000 pore/mm$^2$ on the surface thereof even though the material was HIP treated. Accordingly, these substrates were inappropriate as a hard disc substrate, thin film chip capacitor and a ceramic substrate for hybrid ICs.

Further, with starting powder having a purity of less than 99% as seen in comparative examples 5, 6 and comparative examples 13, 14, or with starting powder having an average particle size of more than 1 $\mu$m as seen in comparative examples 7, 8 and comparative examples 15, 16, the material had to be baked above the baking temperature defined by the present invention. As a result, a lot of pores appeared on the surface of resulting substrates. Therefore, these substrates were again inappropriate as a hard disc substrate, thin film chip capacitor and a ceramic substrate for hybrid ICs.

Thus, as has been apparent from Table 1 and Table 2, the present invention can be understood that a targeted hard disc substrate, thin film chip capacitor and a ceramic substrate for hybrid ICs which are made of titanium oxide or aluminum oxide, having an extremely small number of pores on the surface thereof are obtained only:

1) by using as a starting powder, a highly purified titanium oxide fine powder or highly purified aluminum oxide fine powder having a purity of 99% or more with an average particle size of 1 μm or less; and 2) baking the material at 1,100° to 1300° C. for the case of titanium oxide fine powder and at 1,200° to 1,400° C. for the case of aluminum oxide fine powder, and further, it is possible to obtain a hard disc substrate, thin film chip capacitor and a ceramic substrate for hybrid ICs which have less pores 3) by subjecting the resulting substrate to a HIP treatment.

Next, details of a carrier which suction chucks wafers according to the present invention will be described. The inventors of the invention have earnestly studied the producing process of flat ceramics having a low specific resistance and an extremely small number of pores on the surface thereof, and as a result they found the fact that, in accordance with the following producing processes (1) to (3), it is possible to obtain a targeted ceramic wafer-chucking substrate, thus having completed the present invention.

(1) A process comprising the steps of molding highly purified titanium oxide fine powder, baking the molding in the air or an inert atmosphere, and further subjecting the baked molding to a hot isostatic pressing (HIP) treatment.

(2) A process comprising the steps of molding highly purified titanium oxide fine powder, and baking the molding in a reducing atmosphere.

(3) A process comprising the steps of molding highly purified titanium oxide fine powder, baking the molding in a reducing atmosphere, and further subjecting the baked molding to a hot isostatic pressing (HIP) treatment.

That is, the technical subject of the present invention is to provide a ceramic wafer-chucking substrate having both a first feature of the present invention that the specific resistance is extremely low, and a second feature of the present invention that the surface has an extremely small number of pores.

Then, the present inventors found that, in accordance with the aforementioned producing processes (1) to (3), a titanium oxide sintered body having both the first and second features, more specifically, a titanium oxide sintered body which has a specific resistance of 1.0 Ω·cm or less and in which the number of pores with diameters of 3 μm or more on the surface thereof is 100 pores or less per 1 mm² can be obtained, thus having completed the present invention using the sintered titanium oxide body as the wafer-chucking substrate for wafer chucking devices.

In the above producing processes (1) to (3), a highly purified titanium oxide fine powder used as a starting material preferably has a high purity of 99% or more.

If the purity is less than 99%, it is hardly possible to obtain the second feature of the present invention, that is, a sintered body with an extremely small number of pores on the surface thereof (a sintered body in which the number of pores having diameters of 3 μm or more is 100 pores per 1 mm² or less), thus presenting undesirable outcome (see comparative examples 26 and 27 described below).

The average particle size of the above starting fine powder is preferably 1 μm or less.

If any powder having a size exceeding 1 μm is used, it is difficult to obtain the same second feature of the present invention, or a sintered body with an extremely small number of pores on the surface thereof, thus resulting in undesirable outcome (see comparative examples 8 described below).

As referring to further details as to the highly purified titanium oxide fine powder used as a starting powder, if the starting powder has a purity of less than 99%, or if the average particle size is greater than 1 μm, low temperature sintering properties fail as will be described later and consequently the sintered density can not be enough raised.

Therefore, if the powder is sintered at high-temperatures (exceeding 1,300° C. which is defined by the present invention, e.g., 1,400° C., 1,600° C.) in order to raise the sintered density, grains tend to grow large and pores become large and rough (see comparative examples 22 to 28 described below).

Accordingly, in the present invention, it is preferable to use as the starting material a highly purified titanium oxide fine powder which has an average particle size of not more than 1 μm and is highly purified 99% or more, and it is more preferable to use a titanium oxide powder which has an average particle size of not more than 0.5 μm and is highly purified 99.8% or more.

In the present invention, the above starting fine powder is formed into ceramic green sheets by a typical CIP forming process, the Doctor-blade process, the extrusion process or the like. The thus obtained ceramic green sheet molded by the Doctor-blade process or the extrusion process, is subjected, as required, to a treatment for burning out binder.

Next, the starting material is baked to produce a targeted titanium oxide substrate having both the aforementioned first and second Features by adopting any one of the following processes (1) to (3):

(1) A process comprising the steps of baking in the air or an inert atmosphere, and further conducting a HIP treatment;

(2) A process comprising the step of baking in a reducing atmosphere; and (3) A process comprising the steps of baking in a reducing atmosphere, and further conducting a HIP treatment.

In the aforementioned processes (1) to (3), the baking in the air or a reducing atmosphere is preferably conducted at a temperature of 1,100° to 1,300° C., and more preferably at 1,200° C. and thereabout.

If the baking is conducted at a lower temperature than 1,100° C., sintering itself is unlikely to proceed and therefore well-sintered body is difficult to obtain. On the other hand, if the baking temperature exceeds 1,300° C., it is difficult to obtain the second feature of the present invention, that is, a sintered body with an extremely small number of pores on the surface thereof (a sintered body in which the number of pores having diameters of 3 μm or more is 100 pores per 1 mm² or less), thus presenting undesirable result (refer to comparative example 2, described below).

Referring further to the aforementioned baking temperature, the starting material in the present invention is baked in the air, an inert atmosphere or a reducing atmosphere at lower temperatures of 1,100° to 1,300° C. than a typical baking temperature (1,350° C.) at which titania ceramics are formed. And, a baking temperature exceeding 1,300° C., excessively promotes grain growth (or crystal growth), causing pores to move to the grain boundary phase and making pores rough and large as the grains grow large, thereby bringing about undesirable result.

Accordingly, in the present invention, in order to facilitate the starting material to be sintered at low temperatures (that is, in order to make the low temperature sintering properties effective), the aforementioned highly purified titanium oxide fine powder having an average particle size of not more than 1 μm and being highly purified 99% or more, is to be used as the starting material.

In the aforementioned process (1), the baking in the air or inert atmosphere alone, cannot provide the first feature of the present invention a sintered body with a low specific resistance (a sintered body having a specific resistance of 1.0 Ω·cm or less) (refer to comparative example 2, described below).

Therefore, when this baking process in the air or an inert atmosphere is adopted, it is necessary that the resultant sintered body is further HIP-treated in order to provide the aforesaid first feature a feature of low specific resistance.

By this HIP treatment, for example, a HIP treatment using a carbon heater, the titanium oxide sintered body having been baked in the air or an inert atmosphere becomes semiconductive, thus presenting a desirable specific resistance of 1.0 Ω·cm or less. It should be noted that, besides the function of reducing specific resistance, the HIP treatment also has a function of lessening pores on the surface.

The HIP treatment is preferably conducted at 800° to 1,100° C., or a temperature not higher than the aforementioned baking temperature (1,100° to 1,300° C.), in view of preventing pores from becoming large due to the grain growth. The pressure during the HIP treatment is preferably 500 kg/cm$^2$ or more. A more preferable HIP condition is 1,000° C., 1,500 kg/cm$^2$.

In the aforementioned process (2) of baking in a reducing atmosphere, the baking in a reducing atmosphere causes titanium oxide to be partly reduced and become semiconductive, whereby the resultant substance presents a desirable specific resistance of 1.0 Ω·cm or less.

The reducing atmosphere may be any reducing atmosphere in which titanium oxide can become semiconductive during the baking. For example, it is preferable to perform the baking in nitrogen atmosphere using a carbon heater etc.

The process (2) of baking at 1,100° to 1,300° C. in a reducing atmosphere can provide a titanium oxide sintered body having both the first targeted feature of the present invention, the specific resistance is extremely low and the second targeted feature of the present invention, the surface has a very small number of pores.

Additionally, in order to lessen the pores on surface much more, it is possible to further subject the resultant titanium oxide sintered body obtained in the aforementioned process (2) to a HIP treatment using for example a carbon heater. The HIP treatment is preferably conducted, similarly to the HIP treatment in the above (1), at a baking temperature of 800° to 1,100° C. under a pressure of 500 Kg/cm$^2$ or more, and more preferably conducted at 1,000° C. under 1,500 kg/cm$^2$.

In the present invention, the thus obtained titanium oxide substrates by the above processes (1) to (3) can be surface ground or subjected to the surface lapping, as required.

Then, a sucking hole is drilled in this titanium oxide substrate to thereby provide a wafer-chucking substrate of titanium oxide.

Next, a carrier which chucks wafers according to the present invention will be further described in detail referring to examples of the present invention together with comparative examples.

(Example 11)

Polyvinyl butyral and ethyl alcohol were added to titanium oxide powder having a purity of 99.8% with an average particle size of 0.25 μm and mixed so as to be slurried. Then, a green sheet was prepared from the slurry by the Doctor-blade process. After being subjected to the treatment for burning out binder, the green sheet was baked at a temperature of 1,200° C. in the air atmosphere.

Next, the thus sintered body was HIP treated in a HIP heater having a carbon heater under argon atmosphere at a temperature of 1,000° C. under a pressure of 1,500 kg/cm$^2$.

The specific resistance and the number of pores as to the thus obtained titanium oxide substrate were measured. The result is shown in Table 3. In this case, no pore having a diameter of 30 μm or more was observed on the surface of the substrate.

The aforementioned specific resistance was measured by the four probe method (1 V, 1 kHz). The surface of the substrate to be measured was observed and photographed by a scanning electron microscope and the thus obtained photography was used to estimate the number and diameter of pores on the surface of the substrate. Here, specific resistance values in Table 1 were the measurements at 25° C. while numbers of pores are the counts of pores with an average diameter of 3 μm or more per millimeter square.

(Example 12)

Polyvinyl butyral and ethyl alcohol were added to titanium oxide powder having a purity of 99.8% with an average particle size of 0.25 μm and mixed so as to be slurried. Then, a green sheet was prepared from the slurry by the Doctor-blade process. After being subjected to the treatment for burning out binder, the green sheet was baked at a temperature of 1,200° C. in nitrogen atmosphere by a carbon heater.

The specific resistance and the number of pores as to the thus obtained titanium oxide substrate were measured in the same manner as in example 1. The result is shown in Table 3. In this case, no pore having a diameter of 30 μm or more was observed on the surface of the substrate.

(Example 13)

The sintered body obtained in example 2 was HIP-treated in a HIP furnace having a carbon heater in argon atmosphere at a temperature of 1,000° C. under a pressure of 1,500 kg/cm$^2$ as in the same manner as in the above example 1.

The specific resistance and the number of pores as to the thus obtained titanium oxide substrate were measured in the same manner as in example 11. The result is shown in Table 3. In this case, no pore having a diameter of 30 μm or more was observed on the surface of the substrate.

(Example 14)

A titanium oxide substrate was prepared by the same means as in example 11 except in that titanium oxide powder having a purity of 99.2% with an average diameter of 0.7 μm was used.

The specific resistance and the number of pores as to the thus obtained titanium oxide substrate were measured in the same manner as in example 11. The result is shown in Table 3. In this case, no pore having a diameter of 30 μm or more was observed on the surface of the substrate.

(Comparative Examples 21 to 28)

For the purpose of comparison, with titanium oxide powders each having a purity and an average particle size as shown in Table 3, green sheets were prepared in the same manner as in the above example 1. After being subjected to the treatment for burning out binder, each green sheet was baked under a normal pressure sintering condition shown in the same Table 1 (for comparative examples 23, 25, 27 and 28, further HIP treated in HIP conditions shown in Table 1).

The specific resistance and the number of pores as to each of the thus obtained titanium oxide substrates were measured in the same manner as in example 11. The result is shown in Table 1.

(Comparative Example 29)

Further, for the purpose of comparison, aluminum oxide powder having a purity of 99.8% with an average diameter of 0.6 μm was used to form a green sheet in the same manner as in the above example 11. Then, after being subjected to the treatment for burning out binder, the green sheet was baked at 1,600° C. in the air.

The specific resistance and the number of pores as to the thus obtained aluminum oxide substrate were measured in the same manner as in example 11. The result is shown in Table 1.

falling within the scope of the present invention) was molded and the molding was baked in the air in the same manner as in example 11 and further HIP-treated, a substrate having a specific resistance of 0.7 Ω·cm which is as low as in example 11, with 92 pores/mm$^2$, which falls within a range designated by the present invention, i.e., not more than 100 pores/mm$^2$, although it is greater than that in example 11.

In contrast, in comparative example 11 in which the material was processed in the same condition as in example 11 but was not subjected to a HIP treatment, obtained was a

TABLE 3

EXAMPLE AND COMPARATIVE EXAMPLES

| No. | KIND OF OXIDES | PURITY (%) | AVERAGE PARTICLE SIZE (μm) | NORMAL SINTERING | | HIP TREATMENT CONDITION | | SPECIFIC RESISTANCE Ω·cm | NUMBER OF PORES (PORES/mm$^2$) |
|---|---|---|---|---|---|---|---|---|---|
| | | | | TEMPERATUR (°C.) | ATMOSPHERE | TEMPERATURE (°C.) | PRESSURE (kg/cm$^2$) | | |
| EXAMPLES | | | | | | | | | |
| 11 | TiO$_2$ | 99.8 | 0.25 | 1200 | AIR | 1000 | 1500 | 0.7 | 34 |
| 12 | TiO$_2$ | 99.8 | 0.25 | 1200 | NITROGEN | (UNDONE) | | 0.9 | 70 |
| 13 | TiO$_2$ | 99.8 | 0.25 | 1200 | NITROGEN | 1000 | 1500 | 0.7 | 38 |
| 14 | TiO$_2$ | 99.2 | 0.7 | 1200 | AIR | 1000 | 1500 | 0.7 | 92 |
| COMPARATIVE EXAMPLES | | | | | | | | | |
| 21 | TiO$_2$ | 99.8 | 0.25 | 1200 | AIR | (UNDONE) | | 10$^{12}$ | 70 |
| 22 | TiO$_2$ | 99.8 | 0.25 | 1600 | AIR | (UNDONE) | | 10$^{12}$ | 840 |
| 23 | TiO$_2$ | 99.8 | 0.25 | 1600 | AIR | 1400 | 1500 | 10$^{12}$ | 480 |
| 24 | TiO$_2$ | 99.8 | 0.25 | 1600 | NITROGEN | (UNDONE) | | 0.8 | 920 |
| 25 | TiO$_2$ | 99.8 | 0.25 | 1600 | NITROGEN | 1400 | 1500 | 0.8 | 770 |
| 26 | TiO$_2$ | 92.0 | 0.7 | 1400 | AIR | (UNDONE) | | 10$^{12}$ | 960 |
| 27 | TiO$_2$ | 92.0 | 0.7 | 1400 | AIR | 1200 | 1800 | 0.8 | 550 |
| 28 | TiO$_2$ | 99.2 | 2.1 | 1400 | AIR | 1200 | 1800 | 0.8 | 310 |
| 29 | Al$_2$O$_3$ | 99.8 | 0.6 | 1600 | AIR | (UNDONE) | | 10$^{14}$ | 1000 |

[NOTE]
*Specific resistance values in the above table were measured at 25° C.
*Numbers of pores in the above table are the number of pores with an average diameter of 3 μm or more.
*A carbon heater was used for heat-treating in nitrogen atmosphere.
*HIP treatment was conducted using a HIP furnace having a carbon heater.

As is apparent from Table 3, in example 11 in which titanium oxide powder having a purity of 99.8% with an average particle size of 0.25 μm was molded and the molding was baked at 1,200° C. in the air and the baked molding was further HIP-treated in a reducing atmosphere at 1,000° C. under a pressure of 1,500 kg/cm$^2$, a substrate having a specific resistance of 0.7 Ω·cm with 34 pores/mm$^2$ was obtained.

In example 12 in which the same material as in example 11 was baked in nitrogen atmosphere at 1,200° C., a substrate having a specific resistance of 0.9 Ω·cm with 70 pores/mm$^2$ was obtained.

In example 13 in which the substrate obtained in example 12 was further HIP-treated, a substrate having a specific resistance of 0.7 Ω·cm with 38 pores/mm$^2$ was obtained. From this result, it can be understood that the HIP-treatment will improve the specific resistance as well as the number of pores (specific resistance: 0.9 to 0.7; number of pores: 70 to 38).

Further, in example 14 in which titanium oxide powder having a purity of 99.2% with an average particle size of 0.7 μm (a starting material which has an average diameter of greater and a purity lower than those in example 11 but both substrate with 70 pores/mm$^2$ but having a high specific resistance as of 10$^{12}$ Ω·cm, (as compared to 0.7 Ω·cm in example 11). That is, this comparative example could not produce a sintered body having a low specific resistance (a sintered body having a specific resistance of not more than 1 Ω·cm) to be targeted by the present invention.

In comparative example 12 in which the material was processed in the same manner as in example 11 except in that baking was conducted at a temperature of 1,600° C. in the air with no HIP treatment done, and in comparative example 23 in which the substrate obtained in comparative example 22 was HIP-treated (at 1,400° C. under 1,500 kg/cm$^2$), both comparative examples 22 and 23 only produced substrates having high specific resistances (10$^{12}$ Ω·cm) with 840 pores/mm$^2$ and 480 pores/mm$^2$, respectively.

Further, in comparative example 24 in which the material was processed in the same manner as in example 12 except in that baking was conducted at a temperature of 1,600° C. in nitrogen atmosphere with no HIP treatment done, and in comparative example 25 in which the substrate obtained in comparative example 14 was HIP-treated (at 1,400° C. under 1,500 kg/cm$^2$), both comparative examples 24 and 25 produced substrates having low specific resistances (0.8 Ω·cm) but having as much pores as 920 pores/mm$^2$ and 770 pores/mm, respectively.

In comparative example 26, in which a molding made of a starting material with an average diameter of 0.7 μm as is equivalent to that of example 14 and therefore belongs to the scope of the invention, but having a purity of 92.0% which is beyond the scope of the invention, was baked at 1,400° C. in the air, a substrate having as a high specific resistance as $10^{12}$ Ω·cm with 960 pores/mm$^2$ was obtained.

In comparative example 27 in which a molding of the same starting material used in the above comparative example 26 was baked in the air and further HIP-treated (at 1,200° C. under 1,800 kg/cm$^2$), the specific resistance of a resultant substrate was 0.8 Ω·cm because of the implementation of the HIP treatment, but the number of pores was as much as 550 pores/mm$^2$ because the purity of the starting material was low (92.0%) and the baking was conducted in the air at a temperature (1,400° C.), which is beyond the scope of the present invention.

Further, in comparative example 28 in which a molding of a starting material having a purity of 99.2% which falls within the scope of the invention, with an average particle size of 2.1 μm which falls beyond the scope of the invention, was baked in the air (at 1,400 ° C.), and further HIP-treated (at 1,200° C. under 1,800 kg/cm$^2$), a substrate having a specific resistance of 0.8 Ω·cm but having as much pores as 310 pores/mm$^2$ was obtained.

Moreover, in comparative example 29 in which an alumina sintered body was formed by baking in the air a starting material having a purity of 99.8% with an average particle size of 0.6 μm, the obtained substrate not only exhibited as a high specific resistance as $10^{14}$ Ω·cm but also had as much pores as 1,000 pores/mm$^2$.

Thus, as has been apparent from examples 11 to 14 and comparative examples 21 to 29 in Table 3, the present invention can be understood that a targeted titanium oxide substrate having an extremely small number of pores on the surface thereof and a low specific resistance, or specifically, a titanium oxide substrate in which the specific resistance is 1.0 Ω·cm or less and the number of pores with diameters of 3 μm or more on the surface thereof is not more than 100 pores or less per 1 mm$^2$, is obtained only:

1) by using a highly purified titanium oxide fine powder having a purity of 99% or more with an average particle size of 1 μm or less; and 2) baking the material at 1,100° to 1300° C. in the air or a reducing atmosphere; and 3) requiring a HIP treatment (for example, a HIP treatment in a HIP furnace having a carbon heater) in the case where the baking is conducted in the air. Further, it is also understood that 4) in the case where the baking (sintering) is conducted in a reducing atmosphere in the above 2), the HIP treatment following will improve the factors of the specific resistance and the number of pores much more; and 5) the HIP treatment mentioned in 3) will also improve the factor of the number of pores.

Industrial Applicability

As has been detailed heretofore, a hard disc substrate according to the present invention presents an effect which is able to provide a hard disc substrate made of ceramic, comprising a titanium oxide substrate or an aluminum oxide substrate in which large-sized pores with diameters of 3 μm or more on the substrate surface thereof are extremely rare, i.e., 100 pores per 1 mm$^2$ or less.

Further, as the producing process of the substrate, by using as a starting material titanium oxide or aluminum oxide fine powder and baking it under a specific baking condition, it is possible to reduce large-sized pores to an extremely great extent and make the size of pores small.

Moreover, the present invention is able to provide a hard disc substrate which allows itself to be made highly capacitive.

As has been detailed heretofore, a thin film chip capacitor according to the present invention presents an effect which is able to provide a substrate for thin-film chip capacitors made of ceramic, comprising a titanium oxide substrate or an aluminum oxide substrate in which large-sized pores with diameters of 3 μm or more on the substrate surface thereof are extremely rare, i.e., 100 pores per 1 mm$^2$ or less.

Further, as regards titanium oxide substrates, it is possible to provide a thin-film chip capacitor composed of a titanium oxide substrate which not only has a very small number of large pores with diameters of 3 μm or more on the surface thereof, but also can be used as both a substrate itself and a bottom thin-film electrode, alternatively, which can further serve as a thin-film dielectric. As a result, the present invention is able to provide a thin-film chip capacitor which allows itself to be made to have a high capacitance.

As has been detailed heretofore, a ceramic substrate for a hybrid ICs according to the present invention presents an effect which is able to provide a ceramic substrate for hybrid ICs, comprising a titanium oxide substrate or an aluminum oxide substrate which does not have any coating such as glass coating or the like coated on the surface thereof and in which large-sized pores with diameters of 3 μm or more on the substrate surface thereof are extremely rare, i.e., 100 pores per 1 mm$^2$ or less, and there is no pore with a diameter of 30 μm or more.

Further, as a producing process of the substrate, by using as a starting material titanium oxide or aluminum oxide fine powder and baking it under a specific baking condition, it is possible to completely free the substrate of large-sized pores with diameters of 30 μm or more.

Moreover, the present invention is able to provide a ceramic substrate in which interconnections formed thereon can be fined and therefore highly densified.

As has been detailed above, since a carrier which can chuck the wafer according to the present invention is a wafer chucking device using a wafer-chucking substrate made of titanium oxide which has an extremely low specific resistance of 1.0 Ω·cm or less and in which the number of pores with diameters of 3 μm or more on the surface thereof is 100 pores or less per 1 mm$^2$, it is easy to prevent the wafer-chucking substrate from bearing static charges, and therefore no dust etc. brought by the static charges adsorbs to the substrate. In addition, since there are extremely rare pores with no pore having a diameter of 30 μm or more thereon, no gas etc. will not adsorb thereto, thereby providing remarkable effects, such as making the device free from deterioration of the functions for chucking and holding semiconductor wafers or any other wafers.

Further, it is possible to desirably apply the wafer chucking device of the present invention to a wafer hand or a wafer holder built in a semiconductor integrated circuit fabrication apparatus and it is possible to largely contribute to the increased integration and improved yield of semiconductor devices.

We claim:

1. A wafer chucking device comprising a wafer-chucking substrate for suction chucking and transporting or fixing a wafer, being characterized in that said wafer-chucking substrate is made of titanium oxide and has a specific resistance of 1.0 Ω·cm or less, and the number of pores with diameters of 3 μm or more on the surface thereof is 100 pores or less per 1 mm².

2. A wafer chucking device according to claim 1 wherein said wafer-chucking substrate made of titanium oxide is formed by molding titanium oxide powder having a purity of 99% or more with an average particle size of 1 μm or less, baking the molding in the air atmosphere or an inert atmosphere at a temperature of 1,100° to 1,300° C., and further subjecting the baked molding to a hot isostatic pressing (HIP) treatment under a pressure of 500 kg/cm or more.

3. A wafer chucking device according to claim 1 wherein said wafer-chucking substrate made of titanium oxide is formed by molding titanium oxide powder having a purity of 99% or more with an average particle size of 1 μm or less, and baking the molding in a reducing atmosphere at a temperature of 1,100° to 1,3000° C.

4. A wafer chucking device according to claim 1 wherein said wafer-chucking substrate made of titanium oxide is formed by molding titanium oxide powder having a purity of 99% or more with an average particle size of 1 μm or less, baking the molding in a reducing atmosphere at a temperature of 1,100° to 1,300° C., and further subjecting the baked molding to a hot isostatic pressing (HIP) treatment under a pressure of 500 kg/cm² or more.

* * * * *